United States Patent [19]

De Lange

[11] Patent Number: 5,754,569
[45] Date of Patent: May 19, 1998

[54] APPARATUS AND METHOD FOR COMPARING AND VALIDATING DIGITAL WORDS

[75] Inventor: Willem J. De Lange, Los Altos, Calif.

[73] Assignee: Sun Microsystems, Inc., Mountain View, Calif.

[21] Appl. No.: 654,724

[22] Filed: May 29, 1996

[51] Int. Cl.$^6$ .................. G06F 7/02; H04L 1/00
[52] U.S. Cl. .............................. 371/67.1; 371/48
[58] Field of Search .......... 371/67.1, 48; 361/94; 340/146.2

[56] References Cited

U.S. PATENT DOCUMENTS 5,187,631  2/1993  Baylac et al. .................. 361/94

*Primary Examiner*—Phung M. Chung

*Attorney, Agent, or Firm*—Flehr Hohbach Test Albritton & Herbert LLP; William S. Galliani

[57] ABSTRACT

An apparatus for comparing and validating digital words uses a single dual-logic transistor arrangement to execute comparison and validation functions. A validation dual-logic circuit is achieved with a first configuration of input connections to the dual-logic transistor arrangement. The validation dual-logic circuit identifies a valid state between a valid bit of a first digital word and a valid bit of a second digital word. A comparison dual-logic circuit is achieved with a second configuration of input connections to the dual-logic transistor arrangement. The comparison dual-logic circuit identifies a match between a selected bit of the first digital word and a corresponding bit of the second digital word. The number of comparison dual-logic circuits used corresponds to the bit length of the digital words being compared. A single output node generates a match signal when the first and second digital words are identical and the validation function is satisfied.

20 Claims, 4 Drawing Sheets

APPARATUS AND METHOD FOR COMPARING AND VALIDATING DIGITAL WORDS

BRIEF DESCRIPTION OF THE INVENTION

This invention relates generally to computer cache memories and other devices that compare digital words to determine whether they are equivalent and valid. More particularly, this invention relates to a digital word comparator with a validation function implemented with a set of identical dual-logic circuits that can be configured to perform both comparison and validation operations.

BACKGROUND OF THE INVENTION

A digital value or bit has one of two states—zero or one. A digital word is a sequence of digital values or bits. By way of example, a 16 bit digital word may look as follows: 0100111001010110. Computers operate by processing digital words. It is frequently necessary for a computer to compare two digital words to determine whether they are identical. For example, this operation is necessary when processing addresses of a computer program. A digital word comparator is used in this situation to determine whether a specified address in a computer program matches an address at a cache memory location.

Since the operation of comparing digital words is so prevalent in a computer, it is important to perform it efficiently. The efficiency of the comparison operation is hindered by the requirement that two digital words be validated. That is, many digital words processed by a computer include a single bit indicating whether the digital word is in a valid state. When comparing two digital words, each digital word must be in a valid state. Thus, the validation operation can be thought of as a logical AND operation. That is, if a valid state is represented by a digital one. Then a validation operation is only achieved when both digital words have a valid bit with a value of one. All other combinations of digital valid bits (two digital zeros, a digital zero and a digital one, and a digital one and a digital zero) results in a failed validation operation. This processing can be summarized as follows:

| LOGICAL "AND" TRUTH TABLE FOR A VALIDATION OPERATION | | |
|---|---|---|
| VALID BIT 1 | VALID BIT 2 | OUTPUT |
| 0 | 0 | 0 |
| 0 | 1 | 0 |
| 1 | 0 | 0 |
| 1 | 1 | 1 |

Thus, when comparing two digital words a validation operation frequently needs to be performed. In addition, the comparison of two digital words must identify whether each bit in a first digital word is identical to a corresponding bit in a second digital word. Thus, if the two bits have identical values (they are both zero or they are both one) then a match exists. If a match does not exist (one bit is zero and the other bit is one or one bit is one and the other bit is zero) then the comparison operation fails. The foregoing logical processing can be characterized as an exclusive-or operation. This processing can be summarized as follows:

| "EXCLUSIVE-OR" TRUTH TABLE FOR A COMPARISON OPERATION | | |
|---|---|---|
| VALID BIT 1 | VALID BIT 2 | OUTPUT |
| 0 | 0 | 0 |
| 0 | 1 | 1 |
| 1 | 0 | 1 |
| 1 | 1 | 0 |

For a match to exist between two digital words, the validation function must be satisfied and all comparison operations must be satisfied. In other words, a logical one value must be produced by the single validation operation and all of the comparison operations. If this occurs, then a match hit signal is generated, otherwise a match miss signal is generated.

It can be readily appreciated that since the comparing operation is logically distinct from the validating operation, different circuits are typically used to perform the respective operations. The different circuits typically have different timing and delay characteristics. This is a problem because the output for each circuit is required at the same time. Thus, design complexity arises as efforts are made to produce uniform timing and delay characteristics between distinct logical circuits. This design complexity is typically accompanied by circuit fabrication complexity.

In view of the foregoing, it would be highly desirable to provide a single transistor arrangement that could be used for both comparison and validation operations. Such a circuit would eliminate timing and delay problems. In addition, such a circuit would reduce design complexity and be easier to fabricate. Preferably, the device would have high speed and could be implemented with a relatively low number of transistors.

SUMMARY OF THE INVENTION

An apparatus for comparing and validating digital words uses a single dual-logic transistor arrangement to execute comparison and validation functions. A validation dual-logic circuit is achieved with a first configuration of input connections to the dual-logic transistor arrangement. The validation dual-logic circuit identifies a valid state between a valid bit of a first digital word and a valid bit of a second digital word. A comparison dual-logic circuit is achieved with a second configuration of input connections to the dual-logic transistor arrangement. The comparison dual-logic circuit identifies a match between a selected bit of the first digital word and a corresponding bit of the second digital word. The number of comparison dual-logic circuits used corresponds to the bit length of the digital words being compared. A single output node generates a match signal when the first and second digital words are identical and the validation function is satisfied.

The invention provides dynamic comparison and validation of digital words. Prior art devices rely upon different transistor arrangements to perform the comparison and validation operations. This results in timing and delay variations. These problems are avoided with the present invention since the same dual-logic transistor arrangement is used for both the comparison and validation operations. As a result, the circuit has uniform timing and delay characteristics. Moreover, the circuit has reduced design complexity and is easier to fabricate. The circuit uses dynamic logic. As a result, it has high speed and a relatively low device count.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
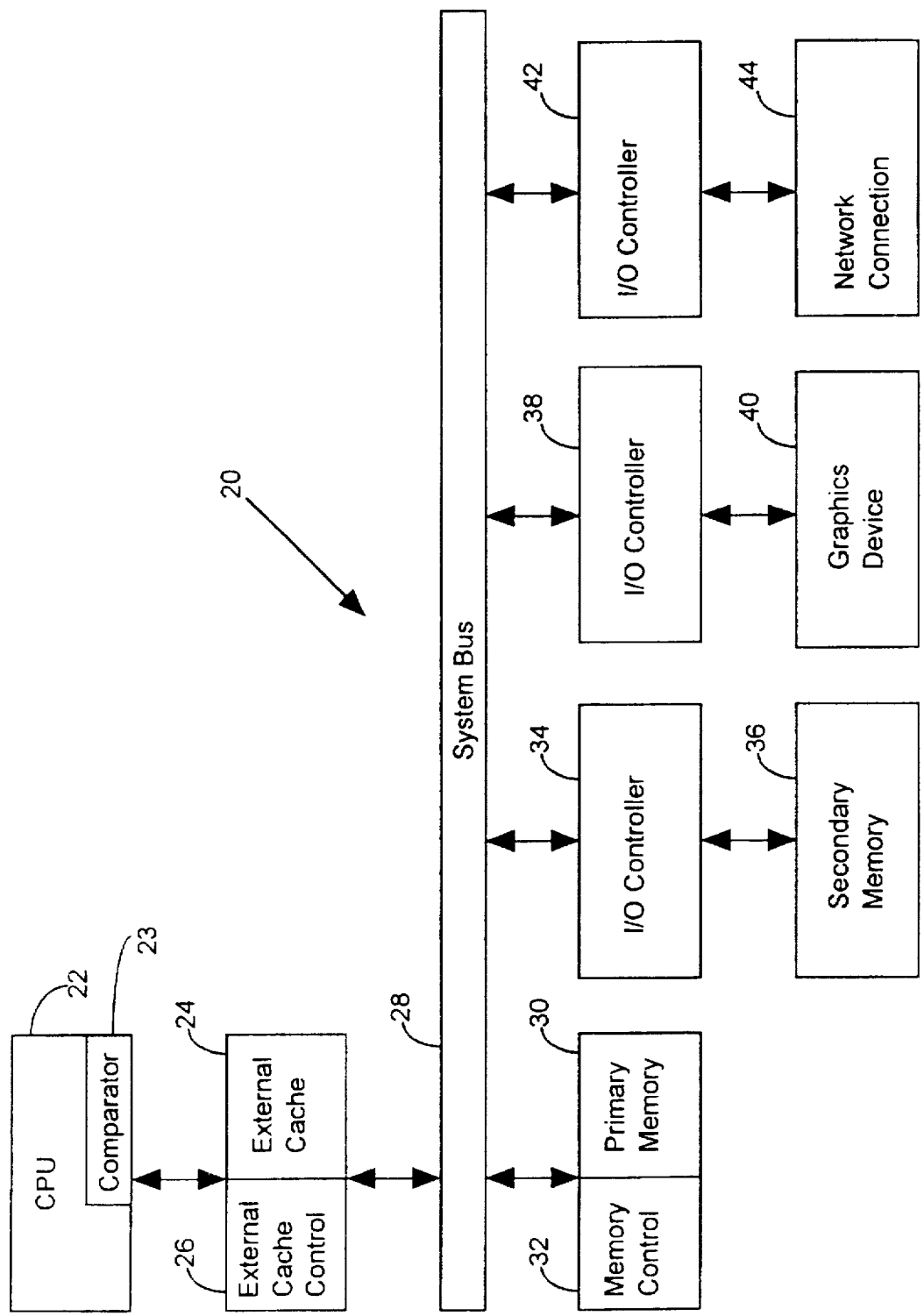
FIG. 1 illustrates a general purpose computer incorporating the digital word validating comparator of the invention.

FIG. 1 illustrates a general purpose computer 20 incorporating the digital word comparator of the invention. The digital word comparator of the invention may be implemented in any number of the devices shown in FIG. 1.

FIG. 1 includes a central processing unit 22, which includes the digital word comparator 23 of the invention. By way of example, the digital word comparator 23 may be used in one or more of the internal caches of the CPU 22.

As known in the art, the CPU 22 executes instructions of a computer program. Each instruction is located at a memory address. Similarly, the data associated with an instruction is located at a memory address. The CPU 22 accesses the specified memory address to fetch the instruction or data stored there.

Most CPUs include an on-board memory called an internal cache. The internal cache stores a set of memory addresses and the instructions or data associated with the memory addresses. A digital word comparator is used to identify whether a required memory address exists in the internal cache.

If a specified address is not in the internal, or L1 cache, then the CPU 22 looks for the specified address in an external cache, also called an L2 cache 24. The external cache 24 has an associated external cache controller 26. The external cache controller 26 may also use the digital word comparator of the invention.

If the address is not in the external cache 24 (a cache miss), then the external cache controller 26 requests access to a system bus 28. When the system bus 28 becomes available, the external cache controller 26 is allowed to route its address request to the primary memory 30. The primary memory 30 has an associated memory controller 32. The memory controller 32 queries the primary memory 30 for the subject address. If the subject address exists in primary memory 30, the data output from the primary memory 30 is applied to the system bus 28. It is then stored in the external cache 24 and is passed to the CPU 22 for processing.

The foregoing processing must be performed for every address request. Indeed, if the address request is not found in primary memory 30, similar processing is performed by an input/output controller 34 associated with the secondary memory 36.

As shown in FIG. 1, there are additional devices connected to the system bus 28. For example, FIG. 1 illustrates an input/output controller 38 operating as an interface between a graphics device 40 and the system bus 28. In addition, the figure illustrates an input/output controller 42 operating as an interface between a network connection circuit 44 and the system bus 28.

The digital word comparator of the invention finds its largest applicability in the internal cache of the CPU 22 and the external cache controller 26 of the external cache 24. However, the digital word comparator of the invention can be incorporated into any of the devices of FIG. 1, if required.

Figure 2:
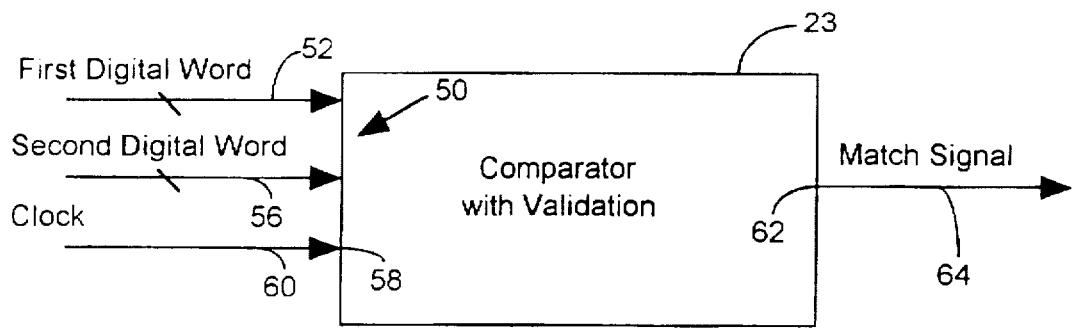
FIG. 2 is a general illustration of the inputs and output of the digital word validating comparator of the invention.

FIG. 2 is a general illustration of a digital word comparator 23 in accordance with the invention. The digital word comparator includes input nodes 50 that are used to receive a first digital word from a bus 52 and a second digital word from a bus 56. The comparator 23 also includes a clock input node 58 to receive a clock signal from line 60. The comparator 23 also includes an output node 62 for applying a match hit or match miss signal on line 64.

Figure 3:
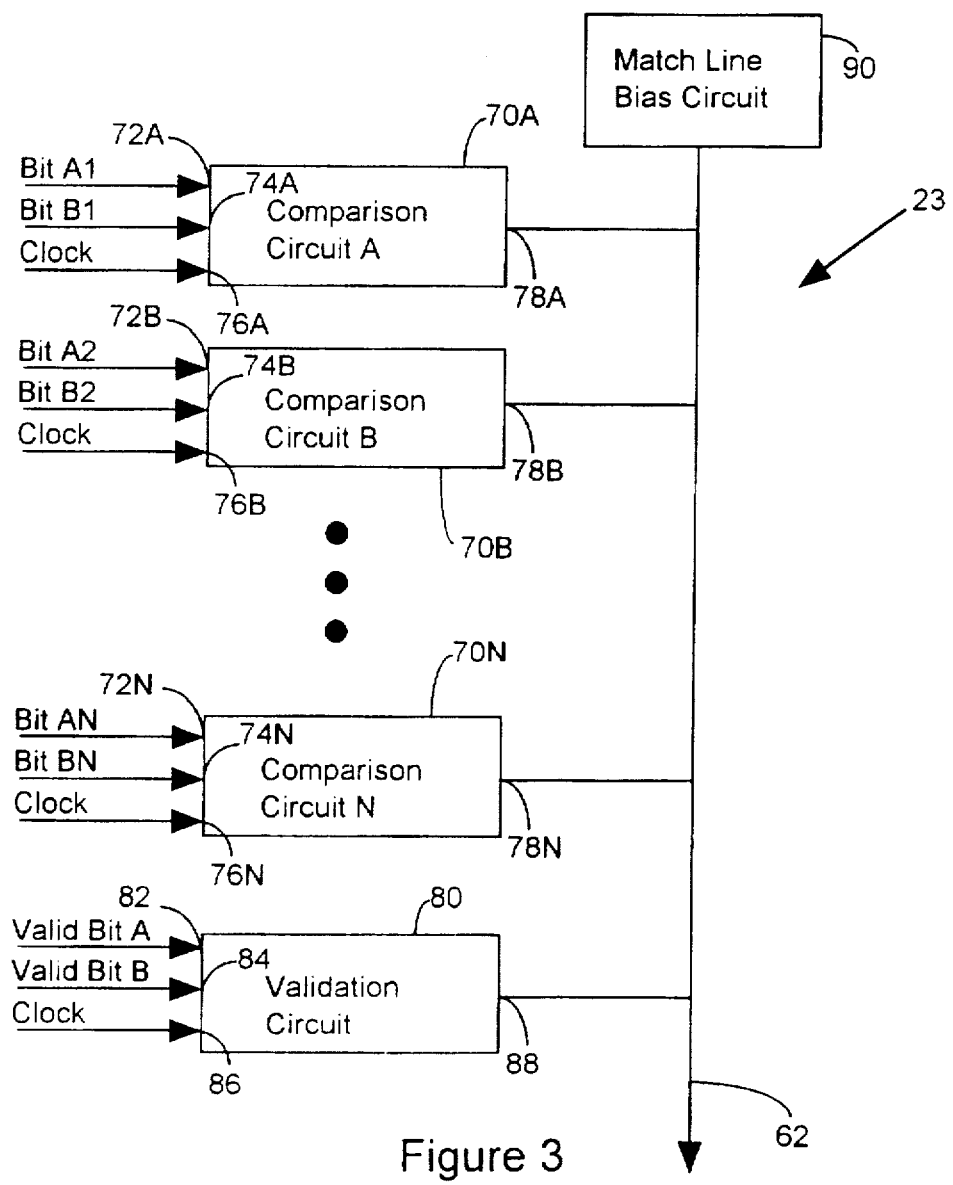
FIG. 3 is an illustration of the dual-logic circuits that are used to construct the digital word validating comparator of the invention.

FIG. 3 is a more detailed illustration of the digital word comparator 23 of FIG. 2. In particular, FIG. 3 illustrates that the digital word comparator 23 includes a set of comparison circuits 70A–70N. Each comparison circuit 70 processes a single bit from the first digital word and a single bit from the second digital word. In addition, each comparison circuit 70 includes a clock input node 76. For example, FIG. 3 illustrates a "Comparison Circuit A" 70A. The circuit 70A includes an input node 72A to receive a first bit (BitA1) of a first digital word and an input node 74A to receive a first bit (BitB1) of a second digital word. In addition, the comparison circuit 70A includes a clock node 76A to receive a clock signal. Finally, the comparison circuit 70A includes an output node 78A. The output node 78A is electrically connected to the output node 62 of the comparator circuit 23.

The comparator circuit 23 includes N comparison circuits 70A–70N. In addition, the circuit 23 includes a single validation circuit 80. The validation circuit 80 includes an input node 82 to receive a valid bit A from the first digital word and an input node 84 to receive a valid bit B from the second digital word. The validation circuit 80 also includes a clock node 86 to receive the clock signal. Finally, the validation circuit 80 includes an output node 88, which is connected to the output node 62 of the validation circuit 23.

The comparator circuit 23 also includes a match line bias circuit 90. The match line bias circuit 90 biases the output node 62 in a digitally high state corresponding to a match hit signal. Thus, if a match exists between a first digital word and a second digital word processed by the circuit 23, then the signal on the output node 62 will remain high, representing a match hit. On the other hand, if any of the comparison circuits 70A–70N fail to establish a match condition or the validation circuit 80 fails to establish a validation condition, then the digital high value on the output node 62 is pulled to a digital low value. As a result, the output node 62 has a digital low value indicating a match miss signal.

In accordance with the invention, a single dual-logic transistor arrangement is used for each comparison circuit 70A–70N and for the validation circuit 80. A first configuration of input connections is used with the dual-logic transistor arrangement to achieve the logical comparison operation. A second configuration of input connections is used with the dual-logic transistor arrangement to achieve the validation operation. Thus, the same configuration of transistors is used for two different logical operations. Since the same transistor configuration is used throughout the circuit 23, there is uniform timing and delay. Moreover, design complexity is reduced and fabrication is facilitated.

Figure 4:
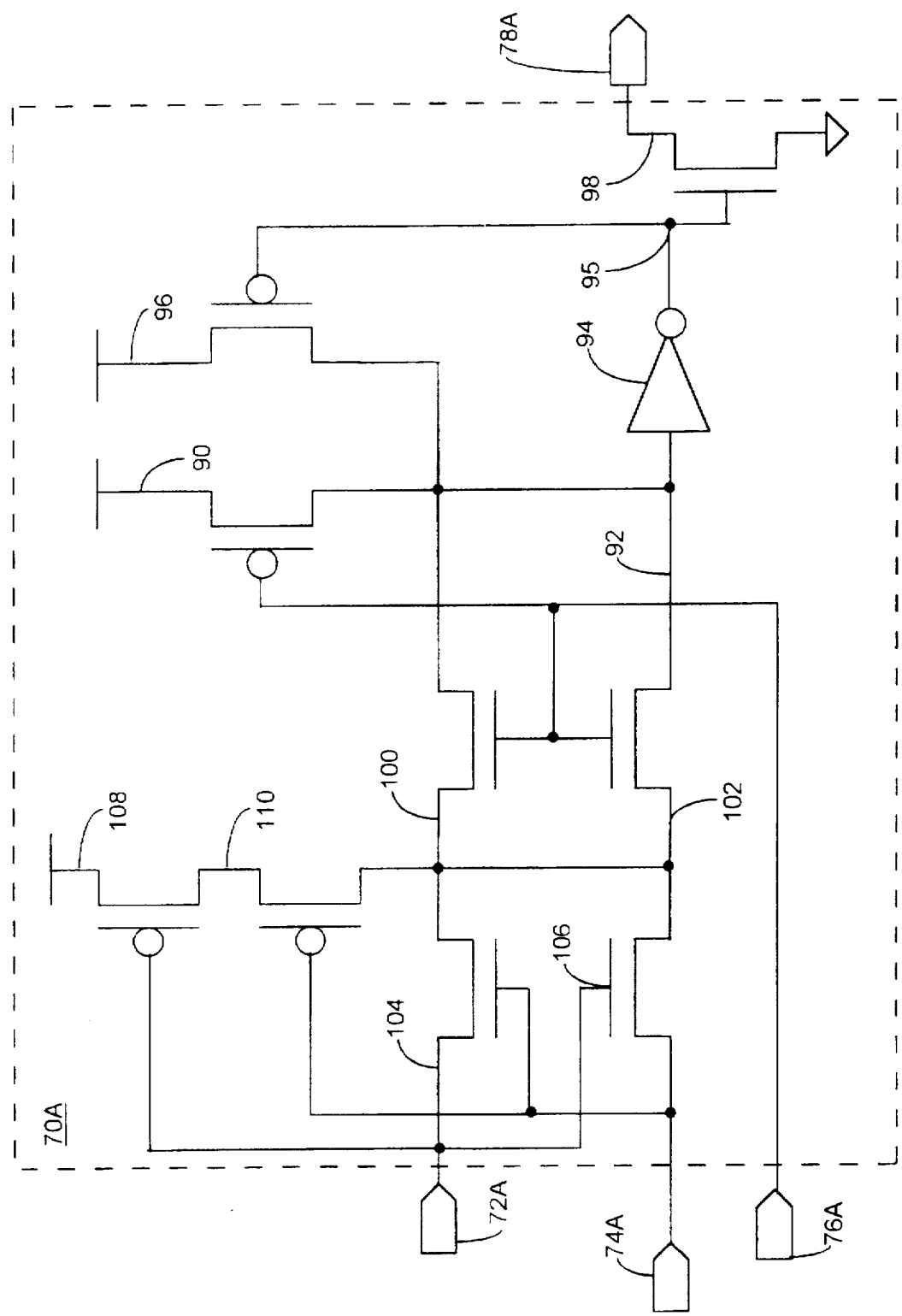
FIG. 4 is an illustration of an embodiment of the dual-logic circuit of the invention configured to perform a comparison operation between two bits.

FIG. 4 illustrates the comparison circuit 70A. The figure also illustrates the previously discussed input nodes 72A, 74A, and 76A. In addition, the figure illustrates the previously discussed output node 78A.

The dual-logic transistor arrangement of the invention includes 9 transistors 90, 96, 98, 100, 102, 104, 106, 108, and 110 and one inverter 94. Transistors 90, 100, and 102 may be thought of as constituting a dynamic precharge and evaluation circuit. Thus, the dual-logic transistor arrangement of the invention is a dynamic circuit. As a result, it has high speed. In addition, as plainly seen in FIG. 4, the circuit has a relatively low device count.

Transistor 98 may be thought of as a match line interface circuit. Transistors 104, 106, 108, and 110 may be thought of as a logic execution circuit, with a first input connection transistor 104 and a second input connection transistor 106.

Transistor 96 and inverter 94 may be considered as a static feedback circuit.

The clock node 76A receives a clock signal. During the precharge period of the clock signal, the clock has a digital low value. The digital low value keeps the NMOS transistors 100 and 102 off. On the other hand, the PMOS transistor 90 is turned-on during the precharge period. As a result, node 92 receives a digital high value. This causes inverter 94 to have a digital low output. Thus, node 95 has a digital low value, causing the PMOS transistor 96 to turn-on. The PMOS transistor 96 keeps node 92 at the digital high value of the supply voltage when the clock signal is high (the evaluation phase) and both inputs 72A and 74A are high. The drive capability of transistor 96 is small compared to transistors 90, 100, 102, 104, and 106. Transistor 96 compensates for leakage and insures a full Vdd level at node 92.

Since node 95 is digitally low, the NMOS pull-down transistor 98 is turned-off. As indicated above, the match line bias circuit 90 keeps the output node 62 of the circuit 23 biased in a digital high state. Since the output node 62 is connected to the output node 78A, the output node 78A has a digital high value. That digital high value does not change during the precharge period because the node 95 is low and thus transistor 98 is turned-off.

During the evaluation phase of the clock cycle, the clock signal has a digital high value. This causes the PMOS transistor 90 to turn-off and the NMOS transistors 100 and 102 to turn-on. At this time, the input logic to the circuit is evaluated. In other words, by turning transistors 100 and 102 on during the evaluation phase, the inputs to the circuit can be processed.

As indicated above, a selected bit from a first digital word is applied to the input node 72A, while a corresponding bit of the second digital word is applied to the input node 74A. If both input bits have a digital zero value, then the NMOS transistors 104 and 106 are turned-off, while the PMOS transistors 108 and 110 are turned-on. The PMOS transistors 108 and 110 drive a digital high value to the input node of the inverter 94. This causes a digital low value at the output node 95. Thus, for two input values of zero, a digital zero is produced, consistent with an exclusive-or operation. The digital low value keeps pull-down transistor 98 turned-off. Thus, the match signal on the output node 78A is still high, indicating a match hit.

If both of the input values are a digital one, then the NMOS transistors 104 and 106 are turned-on. The input signal thereby drives a digital high value to the input node of the inverter 94. This results in the previously described output. Note that this operation is consistent with an exclusive-or operation since two digital high input signals have resulted in a digital low output signal at node 95, which has resulted in a match hit signal at node 78A.

When one input value is a digital high and the other input value is digital low, the input with a digital low value is transferred to the input of the inverter (node 92). For example, if a digital high signal is applied to input node 72A and a digital low value is applied to input node 74A, then transistor 106 turns-on, while transistor 104 remains off. Since transistor 106 is turned-on and it is receiving a digital low input value, that digital low input value is driven to the input of the inverter 94. The inverter receives a low digital input signal despite the fact that transistor 96 is initially on. Recall that the drive of transistor 96 is relatively weak. The digital low value at the input of the inverter 94 causes a digital high value at the output node 95. The digital high value at the output node 95 causes transistor 98 to turn-on. This pulls the digital high signal on the output node 78A low, indicating a match miss.

In sum, if one digital input signal is high and the other digital input signal is low, then a digital low signal is driven to the input of the inverter 94. This causes its output node 95 to be driven high. Thus, inputs of zero and one or one and zero result in a digital high value at node 95, consistent with an exclusive-or operation. The digital high value at node 95 represents a non-matching condition between input bits. This causes transistor 98 to turn-on, which pulls-down the digital high value on node 78A. As a result, the output node 62 is pulled low, producing a match miss signal.

It should be appreciated that if there is a miss-match between any two corresponding bits of the two digital words, then the comparison circuit processing the miss-match pulls the match signal on out node 62 low to generate a match miss signal.

Figure 5:
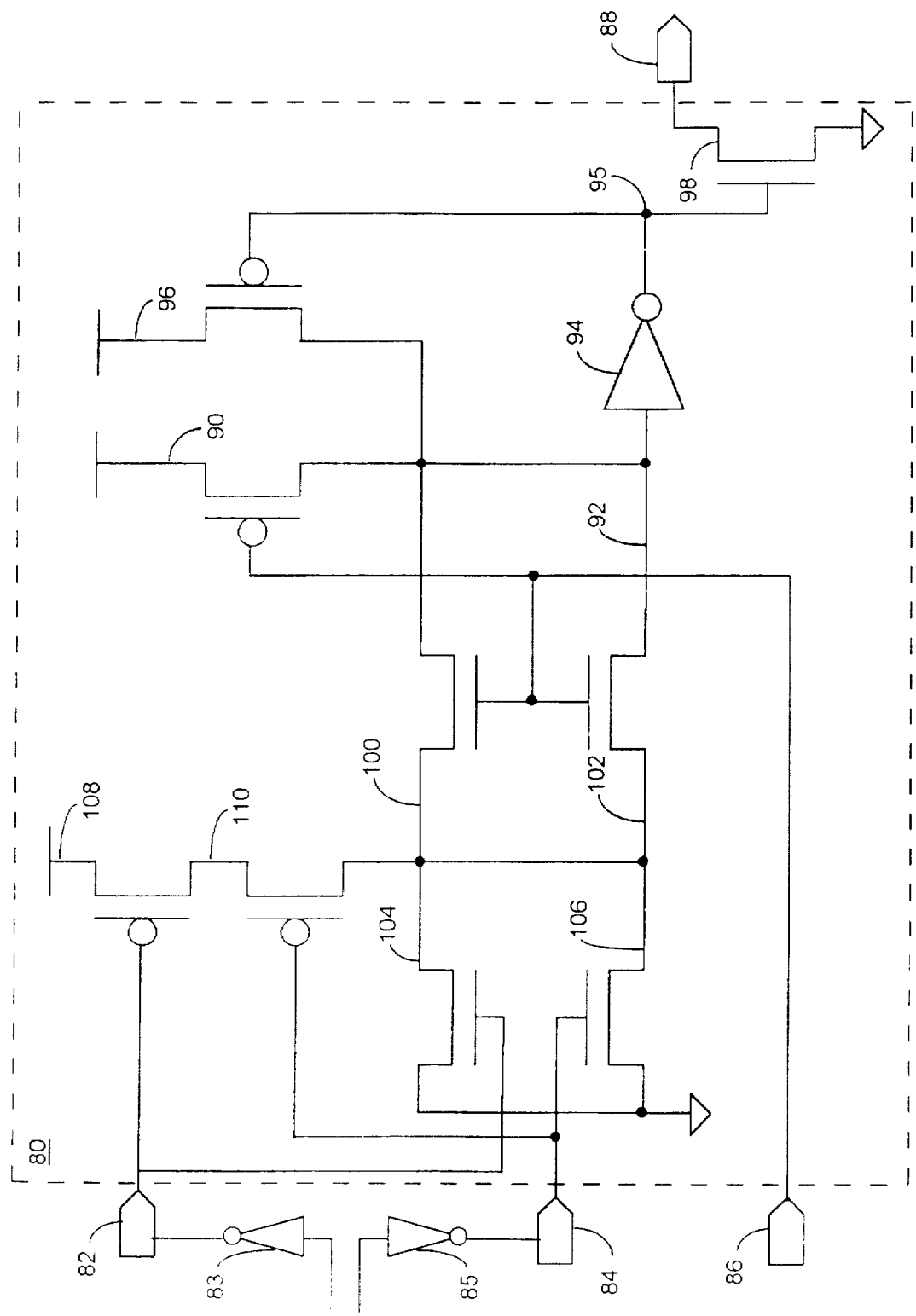
FIG. 5 is an illustration of an embodiment of the dual-logic circuit of the invention configured to perform a validation operation between two bits.

FIG. 5 illustrates a validation circuit 80 in accordance with the invention. Note that the validation circuit 80 has a transistor arrangement that is identical to that of the comparison circuit of FIG. 4. While the transistor arrangement (number of transistors and connections between them, except for inputs) is identical, the circuit of FIG. 5 includes a ground connection for transistors 104 and 106 that does not exist in FIG. 4. This minor distinction does not increase design complexity or necessitate substantive fabrication alterations.

The operation of the validation circuit 80 during the precharge cycle of a clock signal is identical to that described in reference to FIG. 4. Similarly, during the evaluation period, transistors 100 and 102 are turned-on, just as in the previous case, allowing for logical evaluation.

The validation circuit 80 must identify whether valid bits are set. A valid bit is typically set with a value of a digital one. The valid bit is often inverted as it is driven between circuit stages. FIG. 5 illustrates two inverters 83 and 85 that are used to invert the valid bits that are processed by the invention. The inverters are required for the invention to perform the logical AND operation associated with a validation operation. Note that the inverters 83 and 85 can be used with the circuit of FIG. 4 because inversion of the input bits during an exclusive-or operation does not change the output value.

If the two valid bits of the digital words being compared are each zero, then the inverters 83 and 85 will produce a digital high value at the input nodes 82 and 84. This causes transistors 104 and 106 to turn-on. As a result, the precharged node 92 is discharged to the ground node connected to transistors 104 and 106. As a result, the input to the inverter 94 is a digital zero value. This causes the output of the inverter 94 to be digitally high. A digital high value at node 95 causes transistor 98 to turn-on. This results in node 88 being pulled to a digital low value. In sum, two digital low valid bits result in a digital low output signal at node 88. This operation is consistent with a logical AND operation of a validation operation.

If either validation bit has a digital high value, either transistor 104 or 106 will be turned-on. If either transistor is turned-on, the entire charge on node 92 is pulled to ground through the ground connection of the transistor that is turned-on. This results in the inverter 94 observing a digital low input value, causing its output to go high. In turn, this causes pull-down transistor 98 to turn-on, pulling the output node 88 low. Once again, this operation is consistent with a logical AND operation.

If each validation bit is a digital one, then the inverters cause digital zeros to be applied to the input nodes 82 and 84. As a result, the NMOS transistors 104 and 106 are turned-off, while the PMOS transistors 108 and 110 are turned-on. The PMOS transistors drive a digital high value onto node 92. This causes the inverter to generate a digital low value. In this case, node 95 has a digital low value. Thus, transistor 98 is turned-off. Consequently, the output node 88 remains high. Note, then, that two digital high input signals results in a digital high output signal at node 88, which is consistent with a logical AND operation required by a validation operation.

It can now be appreciated that the invention achieves a validation operation and a comparison operation with a single transistor arrangement. The single transistor arrangement provides for uniform timing and delay. It also reduces design and fabrication complexity. The high speed dynamic circuit of the invention has a relatively low device count.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

In the claims:

1. A circuit for comparing and validating two digital words, comprising:

a set of input nodes to receive a first digital word and a second digital word;

an output node;

a validation dual-logic circuit connected between selected input nodes of said set of input nodes and said output node, said validation dual-logic circuit including a first configuration of input connections to a dual-logic transistor arrangement that causes said dual-logic transistor arrangement to perform a validation operation between a valid bit of said first digital word and a valid bit of said second digital word; and a set of comparison dual-logic circuits connected between selected input nodes of said set of input nodes and said output node, each comparison dual-logic circuit of said set of comparison dual-logic circuits including a second configuration of input connections to said dual-logic transistor arrangement that causes said dual-logic transistor arrangement to perform a comparison to identify a match between a selected bit of said first digital word and a corresponding bit of said second digital word.

2. The circuit of claim 1 wherein said dual-logic transistor arrangement includes a logic execution circuit.

3. The circuit of claim 2 wherein said dual-logic transistor arrangement further includes a dynamic precharge and evaluation circuit and a match line interface circuit.

4. The circuit of claim 3 wherein said logic execution circuit includes a first input connection transistor and a second input connection transistor.

5. The circuit of claim 4 wherein said first configuration of input connections includes a first input connection to the gate of said first input connection transistor and a second input connection to the gate of said second input connection transistor.

6. The circuit of claim 5 further comprising a ground connection shared by said first input connection transistor and said second input connection transistor.

7. The circuit of claim 3 further comprising a clock node connected to said dynamic precharge and evaluation circuit.

8. The circuit of claim 3 wherein said match line interface circuit includes a pull-down transistor connected to said output node.

9. The circuit of claim 4 wherein said second configuration of input connections includes a first input connection to the gate of said second input connection transistor and a second input connection to the gate of said first input connection transistor.

10. The circuit of claim 9 wherein said first input connection includes a connection to a port of said first input connection transistor and wherein said second input connection includes a connection to a port of said second input connection transistor.

11. The circuit of claim 1 wherein said validation dual-logic circuit generates a match miss signal on said output node when said first valid bit and said second valid bit is not set.

12. The circuit of claim 1 wherein each comparison dual-logic circuit of said set of comparison dual-logic circuits generates a match miss signal on said output node when said selected bit of said first digital word and said corresponding bit of said second digital word are not equivalent.

13. The circuit of claim 1 further comprising a set of inverters to invert said valid bit of said first digital word and said valid bit of said second digital word.

14. The circuit of claim 1 further comprising a bias circuit connected to said output node to bias said output node in a digital high state corresponding to a match hit signal.

15. The circuit of claim 1 embedded in a central processing unit of a computer.

16. The circuit of claim 15 further comprising a system bus connected to said central processing unit, said system bus including connections to a primary memory and a plurality of input/output controllers.

17. The circuit of claim 1 embedded in a cache memory of a computer.

18. A method of comparing and validating two digital words, said method comprising the steps of:

establishing a first configuration of input connections to a dual-logic transistor arrangement to achieve a validation operation between a valid bit of a first digital word and a valid bit of a second digital word; and creating a second configuration of input connections to said dual-logic transistor arrangement to achieve a comparison operation between a selected bit of said first digital word and a corresponding bit of said second digital word.

19. The method of claim 18 wherein said establishing step results in a logical AND operation between said valid bit of said first digital word and said valid bit of said second digital word.

20. The method of claim 18 wherein said creating step results in a logical exclusive-or operation between said selected bit of said first digital word and said corresponding bit of said second digital word.

* * * * *